(12) United States Patent
Mistretta et al.

(10) Patent No.: US 6,188,922 B1
(45) Date of Patent: Feb. 13, 2001

(54) PHASE CONTRAST IMAGING USING INTERLEAVED PROJECTION DATA

(75) Inventors: Charles A. Mistretta; Andrew V. Barger, both of Madison, WI (US)

(73) Assignee: Wisconsin Alumni Research Foundation, Madison, WI (US)

(*) Notice: Under 35 U.S.C. 154(b), the term of this patent shall be extended for 0 days.

(21) Appl. No.: 09/314,226

(22) Filed: May 18, 1999

Related U.S. Application Data

(60) Provisional application No. 60/115,260, filed on Jan. 8, 1999.

(51) Int. Cl.[7] ............................................. A61B 5/055
(52) U.S. Cl. ............................................. 600/419; 324/306
(58) Field of Search .............................. 600/410, 419; 324/306, 309

(56) References Cited

U.S. PATENT DOCUMENTS

| | | | |
|---|---|---|---|
| 4,796,635 | * | 1/1989 | Dumoulin . |
| 5,093,620 | * | 3/1992 | Pelc et al. ............................ 324/306 |
| 5,133,357 | * | 7/1992 | Dumoulin et al. . |
| 5,204,625 | * | 4/1993 | Cline et al. .......................... 324/306 |
| 5,408,180 | * | 4/1995 | Mistretta et al. .................... 324/306 |
| 6,031,374 | * | 2/2000 | Epstein et al. ...................... 324/306 |

* cited by examiner

Primary Examiner—Marvin M. Lateef
Assistant Examiner—Shawna J Shaw
(74) Attorney, Agent, or Firm—Quarles & Brady LLP

(57) ABSTRACT

A magnetic resonance angiogram (MRA) is acquired using a pulse sequence that samples k-space at a projection angle. The acquired NMR signal is sensitized to spin motion with a bipolar motion encoding gradient and the pulse sequence is repeated to sample k-space at a set of different projection angles. A phase image is reconstructed from the acquired NMR signals using a filtered backprojection technique. Additional sets of projections with different motion encoding directions are acquired at interleaved projection angles, and the reconstructed phase images are combined to provide a velocity image.

12 Claims, 5 Drawing Sheets

PHASE CONTRAST IMAGING USING INTERLEAVED PROJECTION DATA

CROSS-REFERENCE TO RELATED APPLICATIONS

This application is based on U.S. Provisional Application Ser. No. 60/115,260, filed on Jan. 8, 1999 and entitled "PHASE CONTRAST IMAGING USING INTERLEAVED PROJECTION DATA".

STATEMENT REGARDING FEDERALLY SPONSORED RESEARCH

This invention was made with United States Government support awarded by the National Science Foundation: NSF Grant No. 9708319. The United States has certain rights in this invention.

BACKGROUND OF THE INVENTION

The field of the invention is nuclear magnetic resonance ("NMR") imaging methods and systems. More particularly, the invention relates to the acquisition of NMR images indicative of flow, or motion.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins after the excitation signal $B_1$ is terminated, this signal may be received and processed to form an image.

When utilizing these signals to produce images, magnetic field gradients ($G_x$ $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

The prevailing methods used to acquire NMR signals and reconstruct images use a variant of the well known Fourier transform (FT) imaging technique, which is frequently referred to as "spin-warp" The spin-warp technique is discussed in an article entitled "Spin-Warp NMR Imaging and Applications to Human Whole-Body Imaging" by W. A. Edelstein et al., *Physics in Medicine and Biology*, Vol. 25, pp. 751–756 (1980). It employs a variable amplitude phase encoding magnetic field gradient pulse prior to the acquisition of NMR spin-echo signals to phase encode spatial information in the direction of this gradient. In a two-dimensional implementation (2DFT), for example, spatial information is encoded in one direction by applying a phase encoding gradient ($G_y$) along that direction, and then a spin-echo signal is acquired in the presence of a readout magnetic field gradient ($G_x$) in a direction orthogonal to the phase encoding direction. The readout gradient present during the spin-echo acquisition encodes spatial information in the orthogonal direction. In a typical 2DFT pulse sequence, the magnitude of the phase encoding gradient pulse $G_y$ is incremented ($\Delta G_y$) in the sequence of views that are acquired during the scan to produce a set of NMR data from which an entire image can be reconstructed.

To increase the rate at which image frames are acquired, image quality may be sacrificed by acquiring fewer phase encoding views, or by using faster pulse sequences that inherently result in lower quality images. With the spin-warp methods, therefore, there is a trade-off between the number of views that are acquired to achieve the desired image resolution and quality, and the rate at which NMR data for a complete image may be acquired.

Diagnostic studies of the human vasculature have many medical applications. X-ray imaging methods such as digital subtraction angiography ("DSA") have found wide use in the visualization of the cardiovascular system, including the heart and associated blood vessels. Images showing the circulation of blood in the arteries and veins of the kidneys and the carotid arteries and veins of the neck and head have immense diagnostic utility. Unfortunately, however, these x-ray methods subject the patient to potentially harmful ionizing radiation and often require the use of an invasive catheter to inject a contrast agent into the vasculature to be imaged.

Magnetic resonance angiography (MRA) uses nuclear magnetic resonance (NMR) phenomenon to produce images of the human vasculature. Such angiograms provide visualization of the cardiovascular system without subjecting the patient to ionizing radiation. Two basic MRA techniques have been proposed and evaluated. The first class, time-of-flight (TOF) techniques, consists of methods which exploit the differences in signal saturation that exist between flowing blood and stationary tissue. Flowing blood, which is moving through the excited section, is continually refreshed by spins experiencing fewer excitation pulses and is, therefore, less saturated. This effect is magnified by injecting a contrast agent into the patient and timing the acquisition when the contrast bolus flows through the arteries of interest. The result is the desired image contrast between the high-signal blood and the low-signal stationary tissues.

MR methods have also been developed that encode motion into the phase of the acquired signal as disclosed in U.S. Pat. No. Re. 32,701. These form the second class of MRA techniques and are known as phase contrast (PC) methods. Currently, most PC MRA techniques acquire two images, with each image having a different sensitivity to the same velocity component. Angiographic images are then obtained by forming either the phase difference or complex difference between the pair of velocity-encoded images. Phase contrast MRA techniques have been extended so that they are sensitive to velocity components in all three orthogonal directions, but this requires additional data acquisition.

Currently, all known MRA techniques employ a method in which k-space is sampled along Cartesian coordinates. The prevailing method used is the 2DFT or 3DFT fast gradient recalled echo method. While the PC MRA technique does not require the injection of contrast agents into the patient, it is not used in many clinical applications because it usually requires from four to six times as long as the TOF method to acquire the NMR data for a phase contrast MRA image. This is because a separate phase image may be acquired for each axis of motion (x, y and z), and two images (with different velocity encoding) must be acquired for each axis of motion.

SUMMARY OF THE INVENTION

The present invention is a method for acquiring and producing MRA images using the phase contrast technique, and more particularly, acquiring the NMR data using a series of projection acquisitions in which no phase encoding gradients are employed. Rather than phase encoding the acquired NMR data differently in each of a plurality of views, the readout gradient is changed in each acquisition to rotate the projection angle. The NMR data is velocity encoded with a bipolar gradient and a phase image is produced by reconstructing an image from the acquired projection data.

A general object of the invention is to reduce the time required to acquire an MRA image using the phase contrast (PC) technique or to increase the resolution of the MRA image. It has been discovered that far fewer projection views are required to produce a quality MRA image than phase encoded views. Artifacts that normally result when fewer projections are acquired are of less concern in MRA images of the vasculature which typically do not contain large bright objects such as bones.

Another aspect of the invention is to acquire phase contrast MRA data in which velocity encoding along a plurality of directions is employed. For each velocity encoding direction a set of projections are acquired from which a phase image can be reconstructed. The projection angles of each set of velocity encoded acquisitions are distributed substantially throughout 180° and the projection angles of each set are interleaved with the projection angles of the other set or sets. As a result, a phase contrast MRA can be acquired with projection acquisitions in approximately the same scan time as a time-of-flight MRA using a spin-warp acquisition technique.

DESCRIPTION OF THE PREFERRED EMBODIMENT

Figure 1:
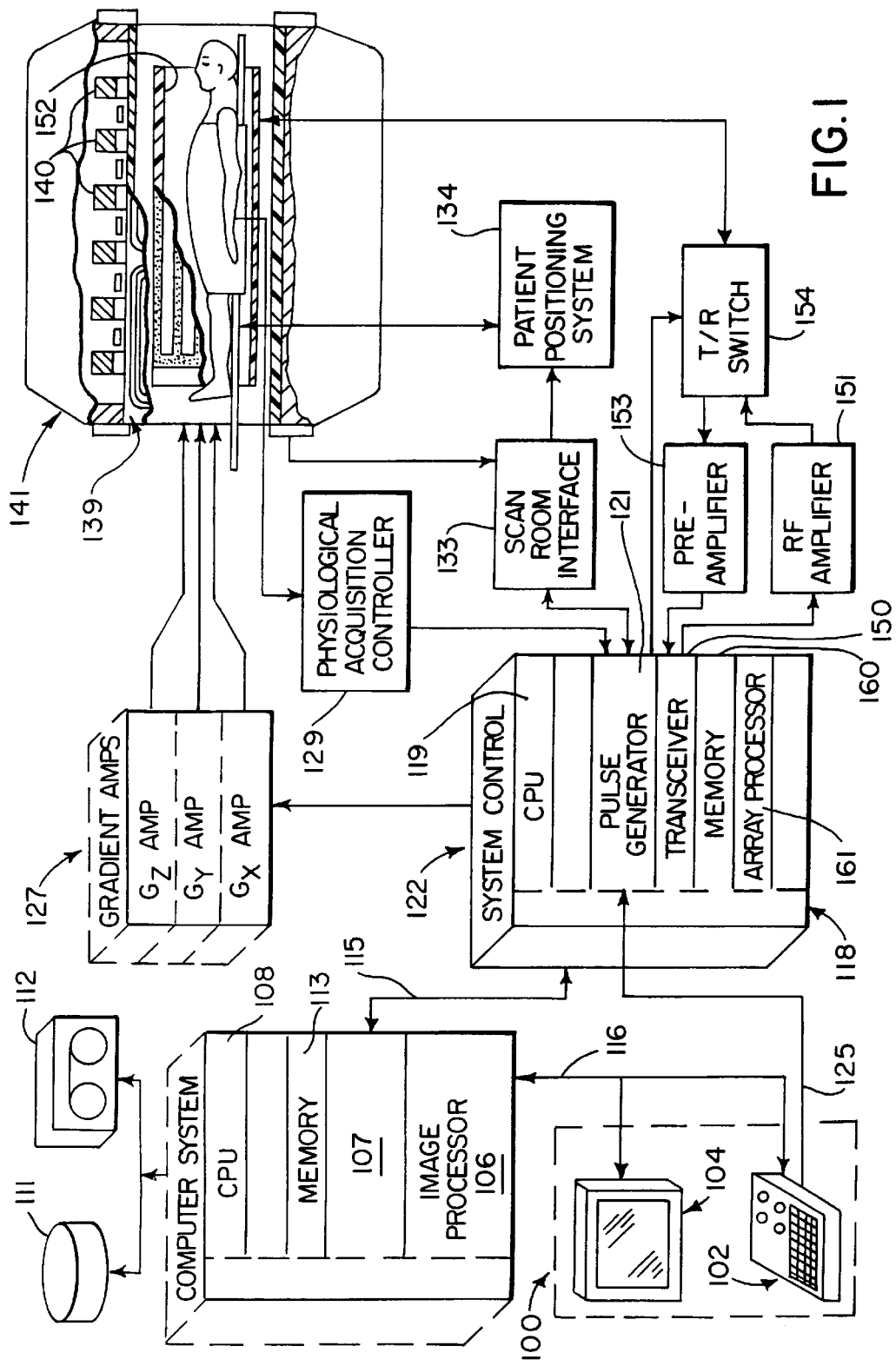
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122 through a backplane 118. When the scan is completed and an entire array of data has been acquired in the memory module 160, an array processor 161 operates to reconstruct one or more images as will be described below. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 2:
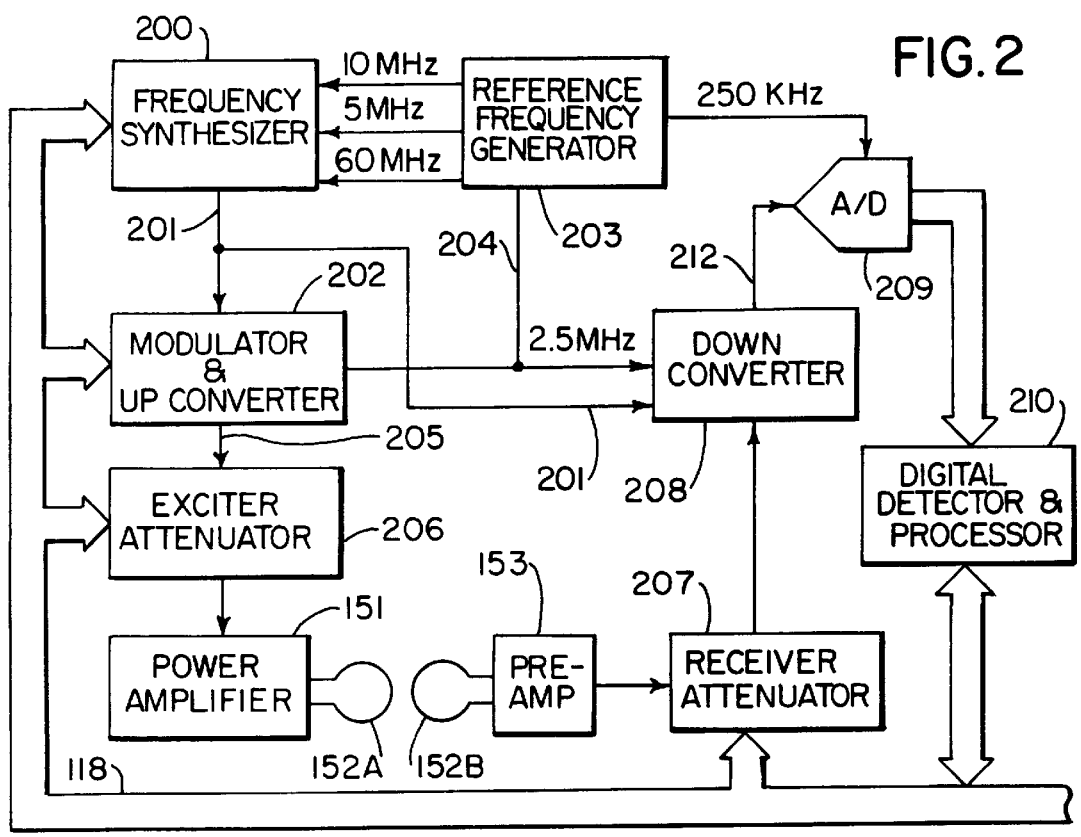
FIG. 2 is an electrical block diagram of the transceiver which forms part of the MRI system of FIG. 1.

Referring particularly to FIGS. 1 and 2, the transceiver 150 produces the RF excitation field B1 through power amplifier 151 at a coil 152A and receives the resulting signal induced in a coil 152B. As indicated above, the coils 152A and B may be separate as shown in FIG. 2, or they may be a single wholebody coil as shown in FIG. 1. The base, or carrier, frequency of the RF excitation field is produced under control of a frequency synthesizer 200 which receives a set of digital signals (CF) from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal R(t) also received from the pulse generator module 121. The signal R(t) defines the envelope of the RF excitation pulse to be produced and is produced in the module 121 by sequentially reading out a series of stored digital values. These stored digital values may, in turn, be changed from the operator console 100 to enable any desired RF pulse envelope to be produced.

The magnitude of the RF excitation pulse produced at output 205 is attenuated by an exciter attenuator circuit 206 which receives a digital command, TA, from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIG. 1 and 2 the signal produced by the subject is picked up by the receiver coil 152B and applied through the preamplifier 153 to the input of a receiver attenuator 207. The receiver attenuator 207 further amplifies the signal by an amount determined by a digital attenuation signal (RA) received from the backplane 118.

The received signal is at or around the Larmor frequency, and this high frequency signal is down converted in a two step process by a down converter 208 which first mixes the NMR signal with the carrier signal on line 201 and then mixes the resulting difference signal with the 205 MHz reference signal on line 204. The down converted NMR signal is applied to the input of an analog-to-digital (A/D) converter 209 which samples and digitizes the analog signal and applies it to a digital detector and signal processor 210 which produces 16-bit in-phase (I) values and 16-bit quadrature (Q) values corresponding to the received signal. The resulting stream of digitized I and Q values of the received signal are output through backplane 118 to the memory module 160 where they are employed to reconstruct an image.

The 2.5 MHz reference signal as well as the 250 kHz sampling signal and the 5, 10 and 60 MHz reference signals are produced by a reference frequency generator 203 from a common 20 MHz master clock signal. For a more detailed description of the receiver, reference is made to U.S. Pat. No. 4,992,736 which is incorporated herein by reference.

Figure 3:
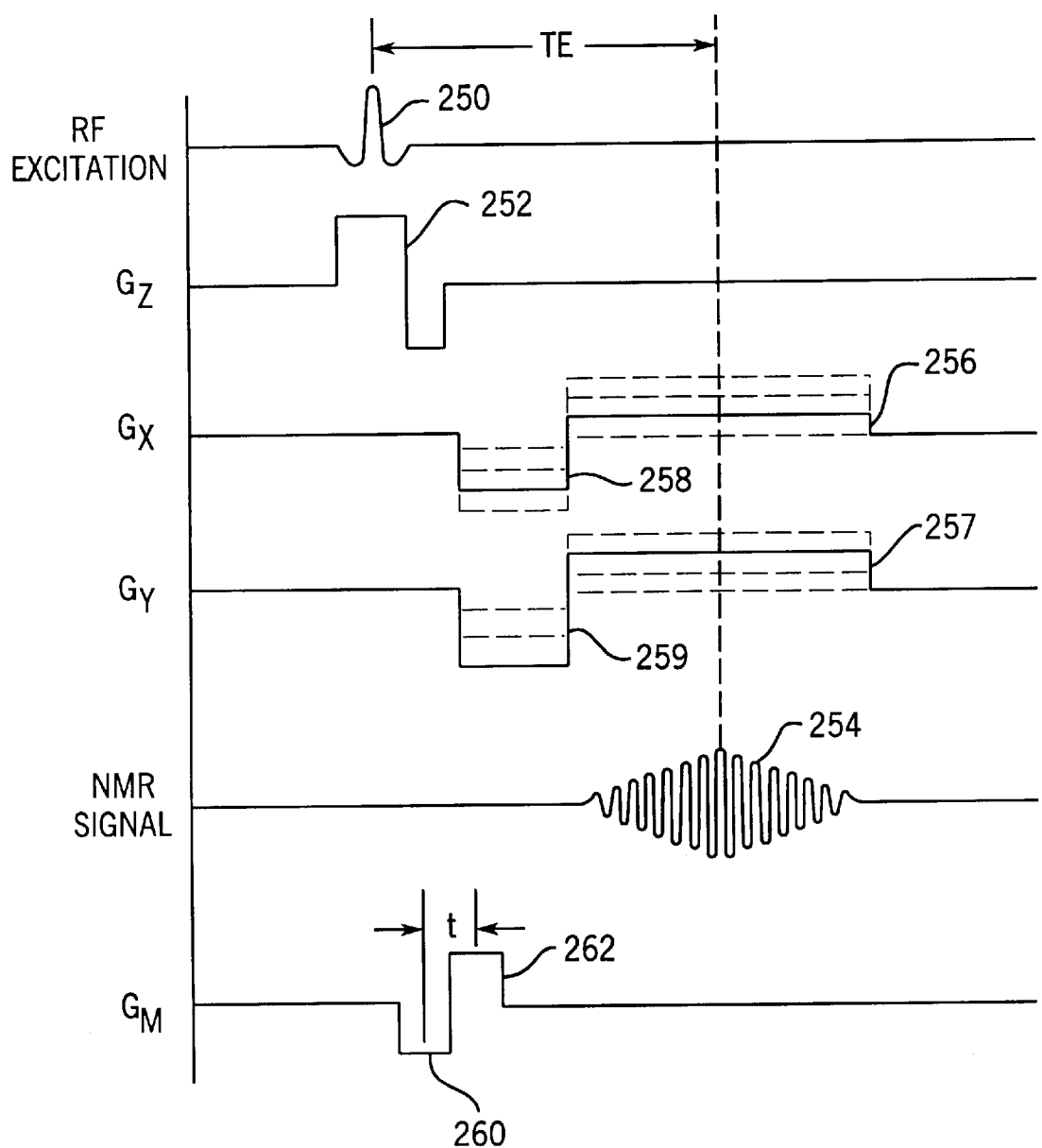
FIG. 3 is a graphic representation of the preferred pulse sequence used by the MRI system of FIG. 1 to practice the present invention.

Referring particularly to FIG. 3, the preferred pulse sequence performed by the pulse generator module 121 is a gradient-recalled echo pulse sequence in which an RF excitation pulse 250 is applied in the presence of a $G_z$ slice select gradient 252, and an NMR echo signal 254 is acquired in the presence of $G_x$ and $G_y$ readout gradients 256 and 257. Each readout gradient 256 and 257 is preceded by a dephasing gradient 258 and 259 respectively which dephases the transverse magnetization produced by RF excitation pulse 250. The readout gradients 256 and 257 rephase the spin magnetization at the echo time TE to produce the peak in the NMR echo signal 254.

Figure 4:
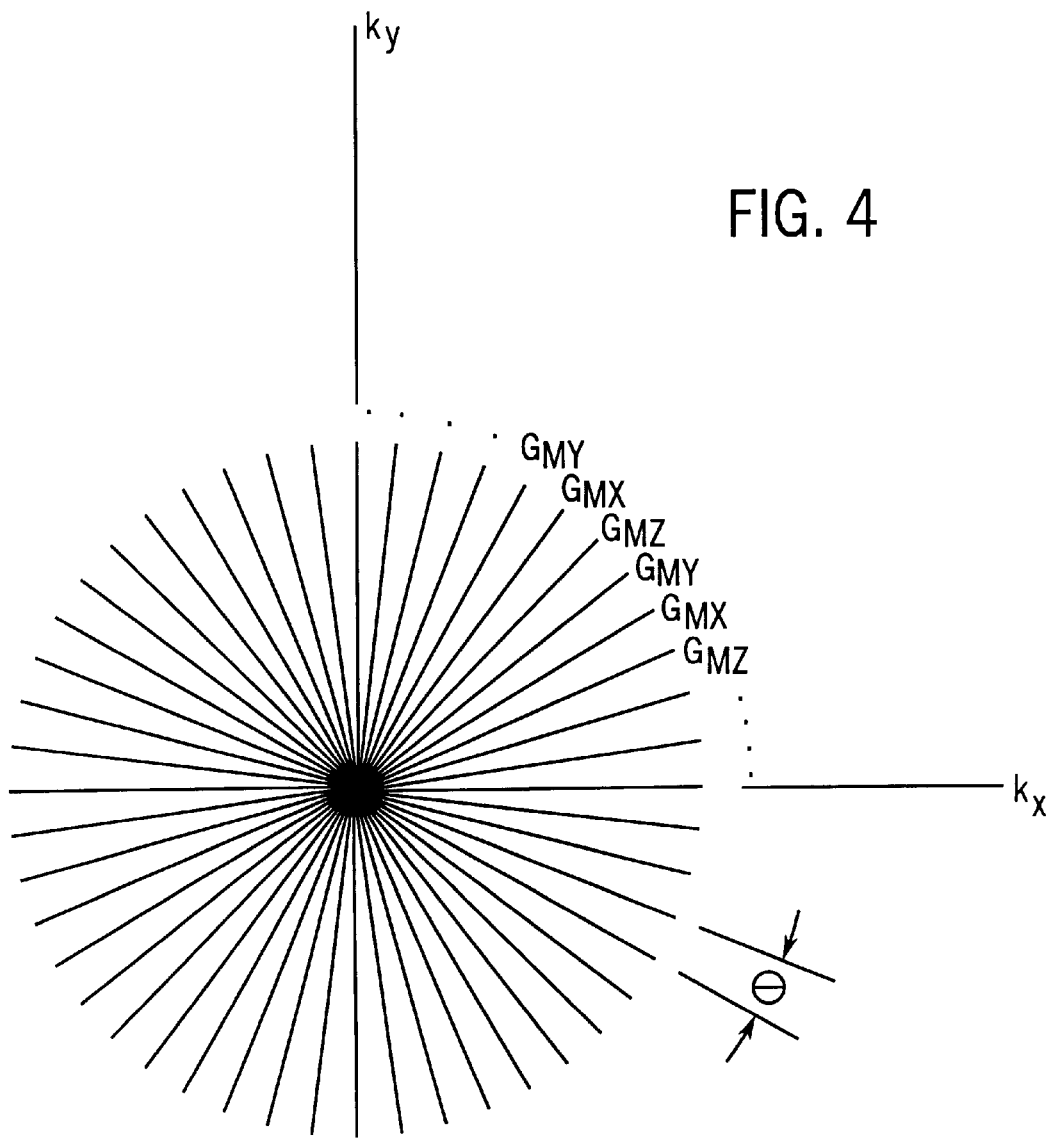
FIG. 4 is a graphic representation of the sets of projections acquired according to the present invention.

There is no phase encoding gradient in this pulse sequence. Instead, the pulse sequence is repeated and the magnitudes of the two readout gradients 256 and 257 are stepped to different values to acquire the NMR echo signal 254 at different projection angles. This is illustrated in FIG. 4, where each line represents the sampling of $k_x$–$k_y$ space accomplished by each acquired NMR echo signal 254. The amplitudes of the readout gradients 256 and 257 and the amplitudes of their corresponding dephasing gradient pulses 258 and 259 are stepped through values such that each successive projection is rotated by an angle θ. In the preferred embodiment projections are acquired at 255 different angles and θ≈0.7°.

Referring again to FIG. 3, to produce a phase contrast MRA image, each acquired projection is motion sensitized by a bipolar motion encoding gradient $G_M$. As is well known in the art, a velocity encoding gradient $G_M$ is comprised of two gradient lobes 260 and 262 of equal size and opposite polarity. The motion encoding gradient $G_M$ can be applied in any direction and it is played out after transverse magnetization is produced by the RF excitation pulse 250 and before the NMR echo signal 254 is acquired. The motion encoding gradient $G_M$ imposes a phase shift to the NMR signals produced by spins moving in the direction of the gradient $G_M$ and the amount of this phase shift is determined by the velocity of the moving spins and the first moment of motion encoding gradient $G_M$. The first moment ($M_1$) is equal to the product of the area of gradient pulse 260 or 262 and the time interval (t) between them. The first moment $M_1$ is set to provide a significant phase shift, but not so large as to cause the phase to wrap around at high spin velocities.

To ensure that phase shifts in the acquired NMR signals 254 are due solely to spin motion, two acquisitions are made at each projection angle and at each motion encoding gradient value. One acquisition is performed with the bipolar gradient $G_M$ as shown in FIG. 3 and a second acquisition is made with the polarity of each gradient lobe 260 and 262 reversed. As will be explained below, the two resulting phase images are subtracted to null any phase shifts common to both acquisitions. The phase shifts caused by spin motion are reinforced due to the reversal of motion encoding gradient polarity.

As indicated above, the motion encoding gradient $G_M$ can be applied in any direction. In the preferred embodiment, the motion encoding gradient $G_M$ is applied separately along each of the gradient axes, x, y and z such that an image indicative of total spin velocity can be produced. That is, an image indicative of velocity along the z axis ($V_z$) is produced by acquiring an image with the bipolar motion encoding gradient $G_M$ added to the $G_z$ gradient waveform shown in FIG. 3, a second velocity image $V_x$ is acquired with the motion encoding gradient $G_M$ added to the $G_x$ gradient waveform, and a third velocity image $V_y$ is acquired with the motion encoding gradient $G_M$ added to the $G_y$ gradient waveform. An image indicative of the total spin velocity is then produced by combining the corresponding pixel values in the three velocity images $$V_T = \sqrt{V_x^2 + V_y^2 + V_z^2} \tag{1}$$

While it is possible to acquire all six NMR echo signals 254 at each projection angle, it is a further teaching of the present invention that the different motion encoding directions are acquired at different, interleaved projection angles. This is illustrated in FIG. 4 where $G_{MX}$ indicates projections acquired with the motion encoding gradient directed along the x axis, $G_{MY}$ indicates projections acquired with the motion encoding gradient directed along the y axis, and $G_{MZ}$ indicates projections acquired with the motion encoding gradient directed along the z axis. A total of 85 different projections are acquired for each of the three motion encoding directions and these are spaced apart at angles of 3θ. Each set of 85 projections are interleaved with the projections acquired for the other two sets with the result that all 255 projections are spaced apart at equal angles of θ.

In the preferred embodiment the projection angle for each motion encoding direction is rotated through a complete 360° revolution. When a quantitative velocity image is to be produced, this provides a better point spread function and more accurate velocity indications throughout the image. If scanning speed is of great importance, however, the projection angle can be rotated through as little as 180° for each motion encoding gradient.

Figure 5:
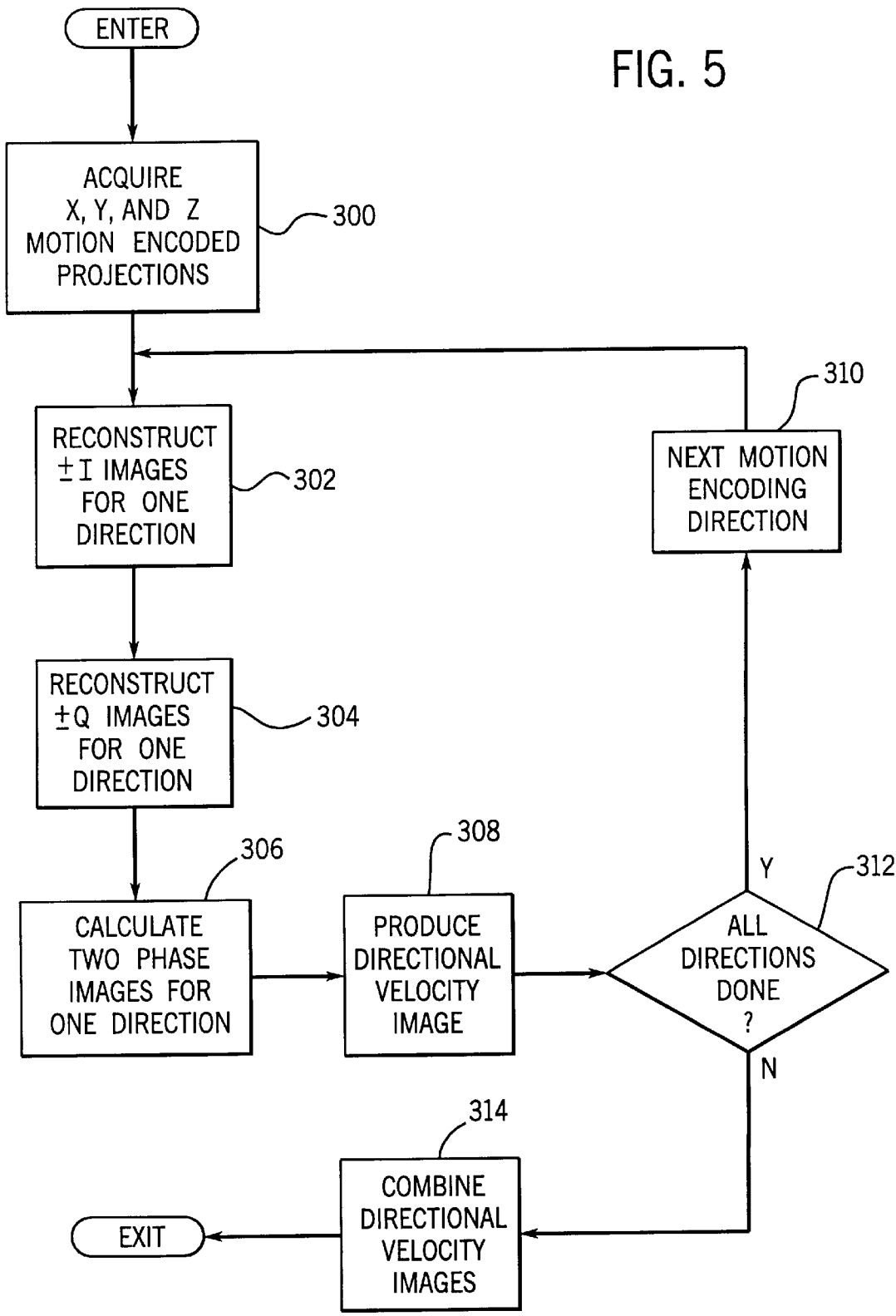
FIG. 5 is a flow chart of the preferred embodiment of the invented method practiced on the MRI system of FIG. 1.

Referring particularly to FIG. 5, the preferred method for practicing the present invention on the MRI system of FIG. 1 includes acquiring the motion encoded projections as described above and indicated at process block 300. A loop is then entered at process block 302 in which a velocity image is produced for spin motion along one gradient axis. More specifically the 85 projections for one velocity encoding direction and one encoding gradient polarity are used to reconstruct an image using the I component of each NMR signal sample as indicated at process block 302. A back projection reconstruction method such as that disclosed in U.S. Pat. Nos. 4,620,153 or 4,625,171 is employed. Each acquired NMR signal includes a set of k-space samples which extend along a line extending radially outward in both directions from the origin of k-space. Each NMR signal is fast Fourier transformed to form one projection view of the subject being imaged. Each such projection view may then be filtered and back projected using any of a number of well known methods such as that described by Herman, "Image Reconstruction From Projection", New York: Academic Press, 1980. The projection image is obtained by calculating the integrated density of substantially all planes which are normal to the plane of the projection image. The reconstruction procedure involves the classical reconstruction from projections widely used in x-ray computed tomography. The preferred method is a convolution-back projection.

It is also possible to reconstruct an image from the k-space samples by first regridding them into a two-dimensional rectilinear k-space data array as described, for example, in U.S. Pat. No. 5,557,203 entitled "Magnetic Resonance Imaging With Combined Back Projection and Fourier Transformation Method", which is hereby incorporated by reference. An image is reconstructed from the 2D rectilinear k-space data array by performing a fast Fourier transformation along each of its axes.

Regardless of the reconstruction method used, the process is repeated for the other motion encoding gradient polarity to yield plus and minus ($I^+$ and $I^-$) images. As indicated at process block 304, similar images are reconstructed using the Q component of the acquired NMR signals. As indicated at process block 306, two phase images are then produced using the ±I and ±Q images. At each image pixel, the phase φ is calculated as follows from the corresponding I and Q values in the reconstructed images:

$$\phi^+ = \tan^{-1} I^+/Q^+;$$

and $$\phi^- = \tan^{-1} I^-/Q^-. \quad (2)$$

The two phase images are then subtracted to produce a velocity image as indicated at process block 308, where the velocity at each pixel is:

$$V \propto \phi^+ - \phi^-. \quad (3)$$

This velocity image indicates the velocity of spins along one motion encoding gradient axis, x, y or z.

The system loops back through process block 310 to produce similar velocity images $V_x$, $V_y$ and $V_z$ for each motion encoding gradient direction. When all the velocity images have been reconstructed as determined at decision block 312, a total velocity image $V_T$ is produced at process block 314. This is accomplished by combining the three directional velocity images $V_x$, $V_y$ and $V_z$ as described above and set forth in equation (1).

Although velocity encoding along all three gradient axes is preferred, there are clinical situations in which velocity encoding along only one or two gradient axes may suffice. For coronary artery measurements, one may, for example, acquire a 2D image in a slice perpendicular to the flow. Only one velocity axis is encoded. This shortens both the acquisition and image reconstruction steps. In this case, the velocity encoding gradient $G_M$ is an oblique angle corresponding to the direction of the coronary artery, and it is produced by simultaneously producing the proper $G_M$ gradient waveform along two or three gradient axes $G_x$, $G_y$, or $G_z$ in the pulse sequence of FIG. 3.

It should also be apparent that many variations are possible in the velocity image reconstruction steps. For example, rather than computing the phase images $\phi^+$ and $\phi^-$ and subtracting them, a complex difference velocity image may be produced from the component images:

$$V = \sqrt{(I^+ - I^-)^2 + (Q^+ - Q^-)^2}. \quad (4)$$

This is repeated for each velocity encoding direction and the separate components are combined to produce a total velocity image $V_T$ as described above and set forth in equation (1).

Another variation is a magnitude reconstruction. In this method the phase difference or complex difference calculations are performed on the k-space data prior to the filtered back projection step or a regridding step. The resulting projections indicate signal phase as a function of position along the readout gradient axis, and when back projected, a velocity image is produced. As with the above reconstruction methods, a velocity image is produced for each motion encoding direction and the velocity images are combined using equation (1).

A reconstruction method requiring fewer back projection steps may also be used. To form a complex difference image, the projections from the plus and minus acquisitions are subtracted in image space. The resulting subtracted projections are then complex backprojected, and the magnitude of the result is taken to form the complex difference image. Similarly, to form a phase difference image, the projections from the plus acquisitions are multiplied by the complex conjugate of the projections from the minus acquisition. The resulting projections are then complex backprojected, and the phase is calculated using the arctangent of the imaginary component divided by the real component of the result.

What is claimed is:

1. A method for producing a magnetic resonance image indicative of spin motion, the steps comprising:
    a) acquiring a first series of NMR signals with an MRI system using a pulse sequence which produces:
        an RF excitation field that produces transverse magnetization in the spins;
        a first motion encoding a gradient field $G_M$ that imparts a phase shift indicative of spin motion in a first direction;
        acquiring an NMR signal in the presence of a readout gradient;

wherein the direction of the readout gradient is rotated from one pulse sequence to the next such that the acquired first series of NMR signals sample k-space at a corresponding first series of different projeciton angles;

b) acquiring a second series of NMR signals with the MRI system using a pulse sequence which produces:

an RF excitation field that produces transverse magnetization in the spins;

a second motion encoding gradient field $G_M$ that imparts a phase shift indicative of spin motion in a second direction;

acquiring an NMR signal in the presence of a readout gradient;

wherein the direction of the readout gradient is rotated from one pulse sequence to the next such that the acquired second series of NMR signals sample k-space at a corresponding second series of different projection angles which are different from the first series of projection angles produced in step a);

c) reconstructing a first velocity image from the first series of NMR signals;

d) reconstructing a second velocity image from the second series of NMR signals; and e) combining the two velocity images to produce the image indicative of spin motion.

2. The method as recited in claim 1 in which the first series of different projection angles are interleaved with the second series of different projection angles.

3. The method as recited in claim 1 in which the reconstruction of the first and second velocity images in steps c) and d) includes:

backprojecting each acquired NMR signal to form respective first and second projection images.

4. The method as recited in claim 3 in which the reconstruction of the first and second velocity images in steps c) and d) includes:

calculating the phase of pixels in the first and second projection images.

5. The method as recited in claim 1 in which the two velocity images are combined in step e) by calculating the square root of the sum of the velocity squared at each pixel in the first velocity image and the velocity squared at each corresponding pixel in the second velocity image.

6. The method as recited in claim 1 in which the first and second series of different projection angles are interleaved and extend over a range of 360°.

7. The method as recited in claim 1 in which the first and second series of different projection angles extend over a range of 180°.

8. The method as recited in claim 1 which includes:
acquiring a third series of NMR signals;
correcting the first series of NMR signals to substantially remove phase shifts not produced by spin motion using information in the third series of NMR signals.

9. The method as recited in claim 1 which includes:

f) acquiring a third series of NMR signals with the MRI system using a pulse sequence which produces:

an RF excitation field that produces transverse magnetization in the spins;

a third motion encoding gradient field $G_M$ that imparts a phase shift indicative of spin motion in a third direction;

acquiring an NMR signal in the presence of a readout gradient;

wherein the direction of the readout gradient is rotated from one pulse sequence to the next such that the acquired third series of NMR signals sample k-space at a corresponding third series of different projections angles;

g) reconstructing a third velocity image; and wherein step e) includes combining the third velocity image to produce the image indicative of spin motion.

10. The method as recited in claim 9 in which the first, second and third directions are orthogonal.

11. The method as recited in claim 9 in which the first, second and third series of different projection angles are interleaved with each other.

12. The method as recited in claim 11 in which the interleaved projection angles are spaced equally around 360°.

* * * * *